United States Patent
Wang et al.

(10) Patent No.: US 12,127,488 B2
(45) Date of Patent: Oct. 22, 2024

(54) RESISTIVE RANDOM ACCESS MEMORY STRUCTURE AND FABRICATION METHOD THEREOF

(71) Applicant: UNITED MICROELECTRONICS CORP., Hsin-Chu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 147 days.

(21) Appl. No.: 17/876,560

(22) Filed: Jul. 29, 2022

(65) Prior Publication Data
US 2023/0413698 A1 Dec. 21, 2023

(30) Foreign Application Priority Data
Jun. 20, 2022 (CN) .......................... 202210696710.7

(51) Int. Cl.
*G11C 11/00* (2006.01)
*H10B 63/00* (2023.01)
*H10N 70/00* (2023.01)

(52) U.S. Cl.
CPC ......... *H10N 70/8833* (2023.02); *H10B 63/80* (2023.02); *H10N 70/021* (2023.02); *H10N 70/063* (2023.02); *H10N 70/066* (2023.02); *H10N 70/841* (2023.02)

(58) Field of Classification Search
CPC ............. H10N 70/8833; H10N 70/066; H10N 70/021; H10N 70/841; H10N 70/063; H10B 63/80
See application file for complete search history.

(56) References Cited

U.S. PATENT DOCUMENTS

| | | | |
|---|---|---|---|
| 2013/0064001 A1* | 3/2013 | Terai | G11C 13/004 257/E47.001 |
| 2016/0190420 A1* | 6/2016 | Miller | H10N 10/852 136/238 |
| 2019/0393409 A1* | 12/2019 | Maniscalco | H01L 21/76843 |
| 2021/0135104 A1* | 5/2021 | Ok | H10N 70/8265 |
| 2022/0399491 A1* | 12/2022 | Cheng | H10B 63/34 |

* cited by examiner

*Primary Examiner* — Min Huang
(74) *Attorney, Agent, or Firm* — Winston Hsu

(57) ABSTRACT

A resistive random access memory structure includes a first inter-layer dielectric layer; a bottom electrode disposed in the first inter-layer dielectric layer; a capping layer disposed on the bottom electrode and on the first inter-layer dielectric layer; and a through hole disposed in the capping layer. The through hole partially exposes a top surface of the bottom electrode. A variable resistance layer is disposed within the through hole. A top electrode is disposed within the through hole and on the variable resistance layer. A second inter-layer dielectric layer covers the top electrode and the capping layer.

18 Claims, 5 Drawing Sheets

RESISTIVE RANDOM ACCESS MEMORY STRUCTURE AND FABRICATION METHOD THEREOF

BACKGROUND OF THE INVENTION

1. Field of the Invention

The present invention relates to the field of semiconductor technology, and in particular, to a resistive random access memory (RRAM) structure and a fabrication method thereof.

2. Description of the Prior Art

Resistive random access memories (RRAMs) are non-volatile memory devices using changes in resistance characteristics of a material to store data. For example, one RRAM cell may include a variable resistance layer disposed between a top electrode and a bottom electrode. A protection layer may be adjacent to the RRAM cell to protect the RRAM cell from being damaged during the manufacturing process (such as an etching process).

However, the existing method of manufacturing RRAMs has low compatibility with logic back-end process. In addition, in order to form the protective layer, three photomasks are required for fabrication, resulting in high production cost.

SUMMARY OF THE INVENTION

It is one object of the present invention to provide an improved resistive random access memory (RRAM) structure and a fabrication method thereof to solve the deficiencies or shortcomings of the prior art.

One aspect of the invention provides a resistive random access memory structure including a first inter-layer dielectric layer; a bottom electrode disposed in the first inter-layer dielectric layer; a capping layer disposed on the bottom electrode and on the first inter-layer dielectric layer; and a through hole disposed in the capping layer. The through hole partially exposes a top surface of the bottom electrode. A variable resistance layer is disposed within the through hole. A top electrode is disposed within the through hole and on the variable resistance layer. A second inter-layer dielectric layer covers the top electrode and the capping layer.

According to some embodiments, the variable resistance layer comprises a tantalum oxide ($TaO_x$) layer and a tantalum oxide ($Ta_2O_5$) layer.

According to some embodiments, the bottom electrode is a copper layer and the tantalum oxide ($TaO_x$) layer is in direct contact with the copper layer.

According to some embodiments, the bottom electrode comprises a recessed region at the top surface of the bottom electrode, and wherein the recessed region is completely filled with the tantalum oxide ($TaO_x$) layer.

According to some embodiments, the top electrode comprises a titanium nitride layer.

According to some embodiments, the resistive random access memory structure further includes an iridium layer disposed between the titanium nitride layer and the variable resistance layer.

According to some embodiments, the tantalum oxide ($Ta_2O_5$) layer has a top surface that is lower than a top surface of the capping layer.

According to some embodiments, the iridium layer conformally covers the top surface of the capping layer, a sidewall of the capping layer above the top surface of the tantalum oxide ($Ta_2O_5$) layer, and the top surface of the tantalum oxide ($Ta_2O_5$) layer.

According to some embodiments, the iridium layer has a top surface that is coplanar with a top surface of the titanium nitride layer.

According to some embodiments, the resistive random access memory structure further includes a via structure disposed in the second inter-layer dielectric layer and in direct contact with the top electrode. Another aspect of the invention provides a method of fabricating a resistive random access memory structure. A first inter-layer dielectric layer is formed. A bottom electrode is formed in the first inter-layer dielectric layer. A capping layer is formed on the bottom electrode and on the first inter-layer dielectric layer. A through hole is formed in the capping layer. The through hole partially exposes a top surface of the bottom electrode. A variable resistance layer is formed within the through hole. A top electrode is formed within the through hole and on the variable resistance layer. A second inter-layer dielectric layer is formed to cover the top electrode and the capping layer.

According to some embodiments, the variable resistance layer comprises a tantalum oxide ($TaO_x$) layer and a tantalum oxide ($Ta_2O_5$) layer.

According to some embodiments, the bottom electrode is a copper layer and the tantalum oxide ($TaO_x$) layer is in direct contact with the copper layer.

According to some embodiments, the bottom electrode comprises a recessed region at the top surface of the bottom electrode, and wherein the recessed region is completely filled with the tantalum oxide ($TaO_x$) layer.

According to some embodiments, the top electrode comprises a titanium nitride layer.

According to some embodiments, an iridium layer is formed between the titanium nitride layer and the variable resistance layer.

According to some embodiments, the tantalum oxide ($Ta_2O_5$) layer has a top surface that is lower than a top surface of the capping layer.

According to some embodiments, the iridium layer conformally covers the top surface of the capping layer, a sidewall of the capping layer above the top surface of the tantalum oxide ($Ta_2O_5$) layer, and the top surface of the tantalum oxide ($Ta_2O_5$) layer.

According to some embodiments, the iridium layer has a top surface that is coplanar with a top surface of the titanium nitride layer.

According to some embodiments, a via structure is formed in the second inter-layer dielectric layer, wherein the via structure is in direct contact with the top electrode.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
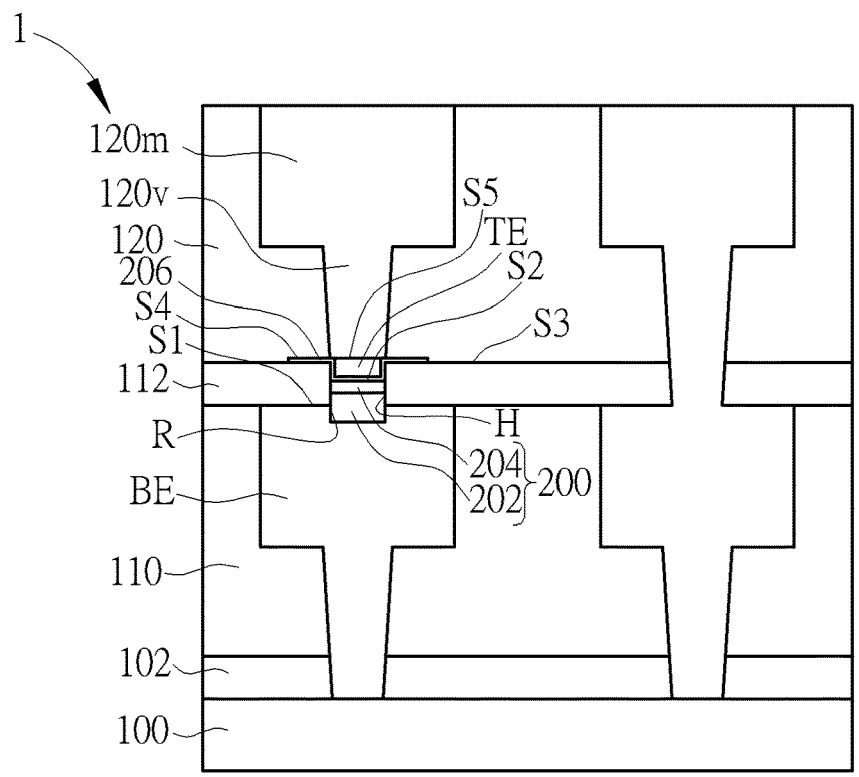
FIG. 1 is a schematic cross-sectional view of a resistive random access memory structure according to an embodiment of the present invention.

Please refer to FIG. 1, which is a schematic cross-sectional view of a resistive random access memory structure 1 according to an embodiment of the present invention. As shown in FIG. 1, the resistive random access memory structure 1 includes a first interlayer dielectric layer 110 on a substrate 100. According to an embodiment of the present invention, the substrate 100 may be a semiconductor substrate, for example, a silicon substrate. According to an embodiment of the present invention, the first interlayer dielectric layer 110 may be an ultra-low dielectric constant (ULK) material layer. According to an embodiment of the present invention, a capping layer 102 may be formed between the first interlayer dielectric layer 110 and the substrate 100. According to an embodiment of the present invention, for example, the capping layer 102 may be a nitrogen-doped silicon carbide (NDC) layer.

According to an embodiment of the present invention, a bottom electrode BE is disposed in the first interlayer dielectric layer 110. According to an embodiment of the present invention, the bottom electrode BE may be a copper layer formed using a copper damascene process. According to an embodiment of the present invention, a capping layer 112 is disposed on the bottom electrode BE and the first interlayer dielectric layer 110. For example, the capping layer 112 may be a nitrogen-doped silicon carbide (NDC) layer, according to embodiments of the present invention.

According to an embodiment of the present invention, a through hole H is provided in the capping layer 112. The through hole H partially exposes the top surface S1 of the bottom electrode BE. According to an embodiment of the present invention, the bottom electrode BE includes a recessed region R, which is recessed into the top surface S1 of the bottom electrode BE.

According to an embodiment of the present invention, the variable resistance layer 200 is disposed in the through hole H. According to an embodiment of the present invention, the variable resistance layer 200 may include a tantalum oxide (TaO$_x$) layer 202 and a tantalum oxide (Ta$_2$O$_5$) layer 204. According to an embodiment of the present invention, the tantalum oxide (TaO$_x$) layer 202 is in direct contact with the bottom electrode BE. According to an embodiment of the present invention, the recessed region R is completely filled with the tantalum oxide (TaO$_x$) layer 202. According to an embodiment of the present invention, the top surface S2 of the tantalum oxide (Ta$_2$O$_5$) layer 204 is lower than the top surface S3 of the capping layer 112.

According to an embodiment of the present invention, a top electrode TE is disposed on the variable resistance layer 200 in the through hole H. According to an embodiment of the present invention, the top electrode TE may include a titanium nitride layer. According to an embodiment of the present invention, the resistive random access memory structure 1 further includes an iridium (Ir) layer 206 disposed between the top electrode TE and the variable resistance layer 200. According to an embodiment of the present invention, the iridium layer 206 conformally covers the top surface S3 of the capping layer 112, the sidewall of the capping layer 112 above the top surface S2 of the tantalum oxide (Ta$_2$O$_5$) layer 204, and the top surface S2 of the tantalum oxide (Ta$_2$O$_5$) layer 204. According to the embodiment of the present invention, the top surface S4 of the iridium layer 206 is coplanar with the top surface S5 of the top electrode TE.

According to an embodiment of the present invention, the resistive random access memory structure 1 further includes a second interlayer dielectric layer 120 covering the top electrode TE and the capping layer 112. According to an embodiment of the present invention, the resistive random access memory structure 1 further includes a via structure 120v disposed in the second interlayer dielectric layer 120 and in direct contact with the top electrode TE. According to the embodiment of the present invention, the via structure 120v may be electrically connected to the wire structure 120m.

Figure 2:
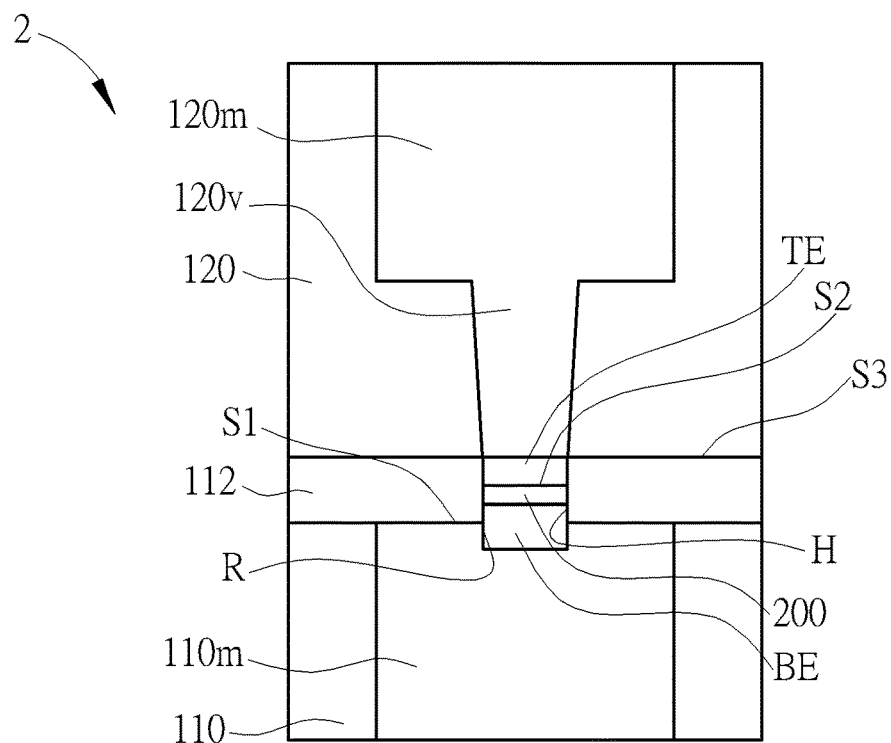
FIG. 2 is a schematic cross-sectional view of a resistive random access memory structure according to another embodiment of the present invention.

Please refer to FIG. 2, which is a schematic cross-sectional view of a resistive random access memory structure 2 according to another embodiment of the present invention. As shown in FIG. 2, the resistive random access memory structure 2 includes a first interlayer dielectric layer 110, for example, an ultra-low dielectric constant (ULK) material layer. According to an embodiment of the present invention, a metal structure 110 m is disposed in the first interlayer dielectric layer 110. According to an embodiment of the present invention, the metal structure 110m may be a copper layer formed by a copper damascene process. According to an embodiment of the present invention, a capping layer 112 is disposed on the metal structure 110 m and the first interlayer dielectric layer 110. For example, the capping layer 112 may be a nitrogen-doped silicon carbide layer, according to embodiments of the present invention.

According to an embodiment of the present invention, a through hole H is disposed in the capping layer 112. The through hole H partially exposes the top surface S1 of the metal structure 110m. According to an embodiment of the present invention, the metal structure 110m includes a recessed region R, which is recessed into the top surface S1 of the metal structure 110m.

According to an embodiment of the present invention, the bottom electrode BE, the variable resistance layer 200 and the top electrode TE are disposed in the through hole H. As shown in FIG. According to an embodiment of the present invention, the bottom electrode BE may be a tantalum nitride layer. According to an embodiment of the present invention, the top electrode TE may be a titanium nitride layer. According to an embodiment of the present invention, the variable resistance layer 200 may include hafnium oxide (HfO$_x$). According to an embodiment of the present invention, the variable resistance layer 200 is in direct contact with the bottom electrode BE. According to the embodiment of the present invention, the recessed region R is completely filled with the variable resistance layer 200. According to the embodiment of the present invention, the top surface S2 of the variable resistance layer 200 is lower than the top surface S3 of the capping layer 112. According to the embodiment of the present invention, in the through hole H, the variable resistance layer 200 directly contacts the top electrode TE.

According to an embodiment of the present invention, the resistive random access memory structure 2 further includes a second interlayer dielectric layer 120 covering the top electrode TE and the capping layer 112. According to an embodiment of the present invention, the resistive random access memory structure 2 further includes a via structure 120v disposed in the second interlayer dielectric layer 120 and in direct contact with the top electrode TE. According to the embodiment of the present invention, the via structure 120v may be electrically connected to the wire structure 120m.

Figure 3:
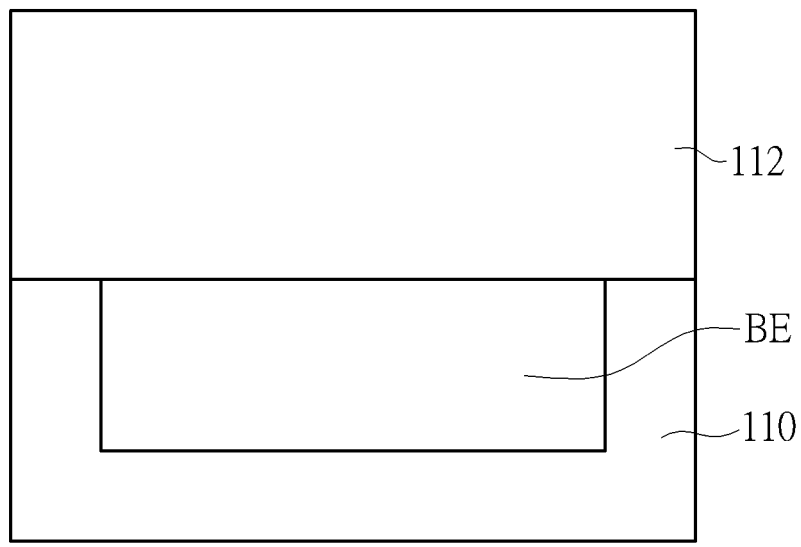
FIG. 3 to FIG. 10 are schematic diagrams illustrating a method for fabricating the resistive random access memory structure of FIG. 1 according to an embodiment of the present invention.

Please refer to FIG. 3 to FIG. 10, which are schematic diagrams of a method for fabricating the resistive random access memory structure of FIG. 1 according to an embodiment of the present invention. As shown in FIG. 3, the bottom electrode BE is first formed in the first interlayer dielectric layer 110. According to an embodiment of the present invention, the bottom electrode BE may be a copper layer formed using a copper damascene process. According to an embodiment of the present invention, a capping layer 112 is then formed on the bottom electrode BE and the first interlayer dielectric layer 110. For example, the capping layer 112 may be a nitrogen-doped silicon carbide layer, according to embodiments of the present invention.

Figure 4:
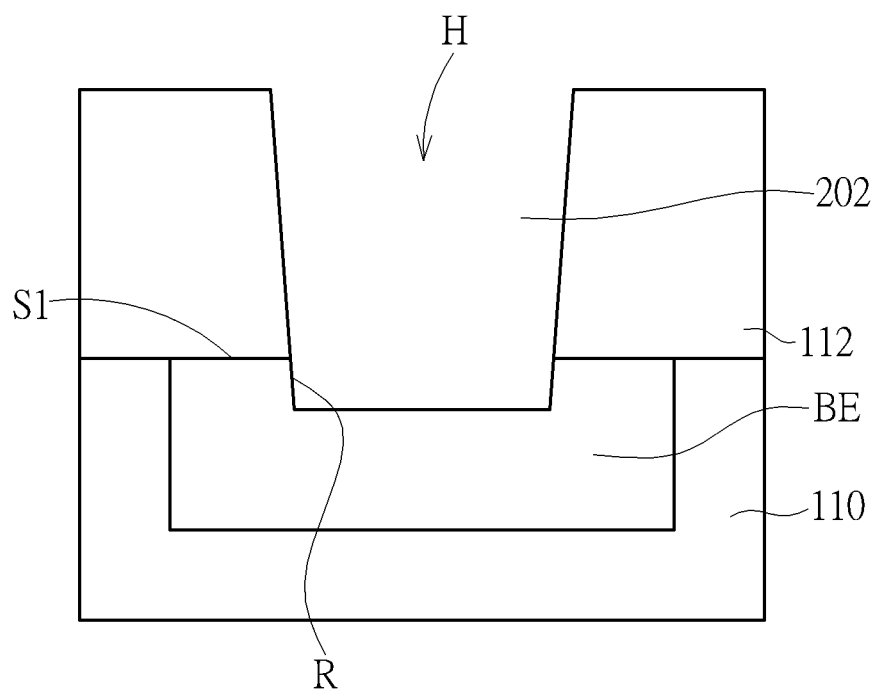

As shown in FIG. 4, next, a through hole H is formed in the capping layer 112. The through hole H partially exposes the top surface S1 of the bottom electrode BE. According to an embodiment of the present invention, the bottom electrode BE includes a recessed region R, which is recessed into the top surface S1 of the bottom electrode BE.

Figure 5:
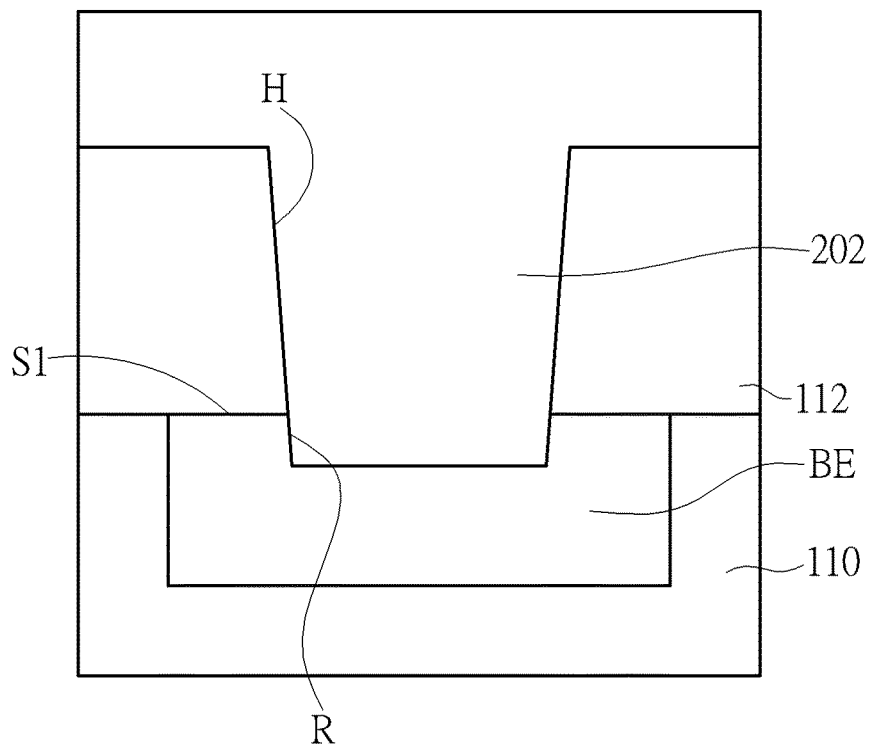
Figure 6:
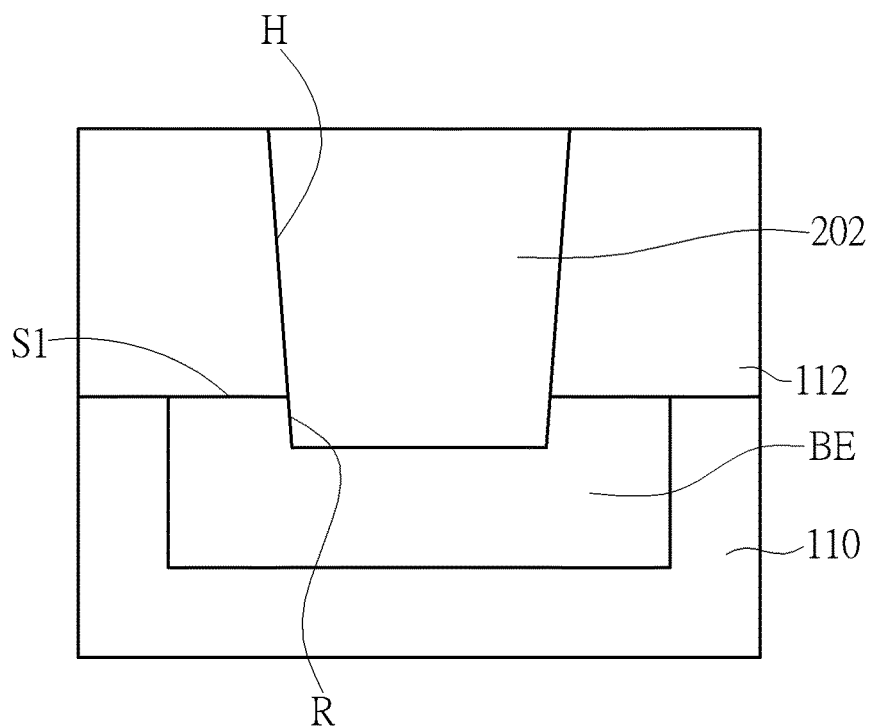

According to an embodiment of the present invention, as shown in FIG. 5 and FIG. 6, a tantalum oxide (TaO$_x$) layer 202 is then formed in the through hole H and planarized by a chemical mechanical polishing process.

Figure 7:
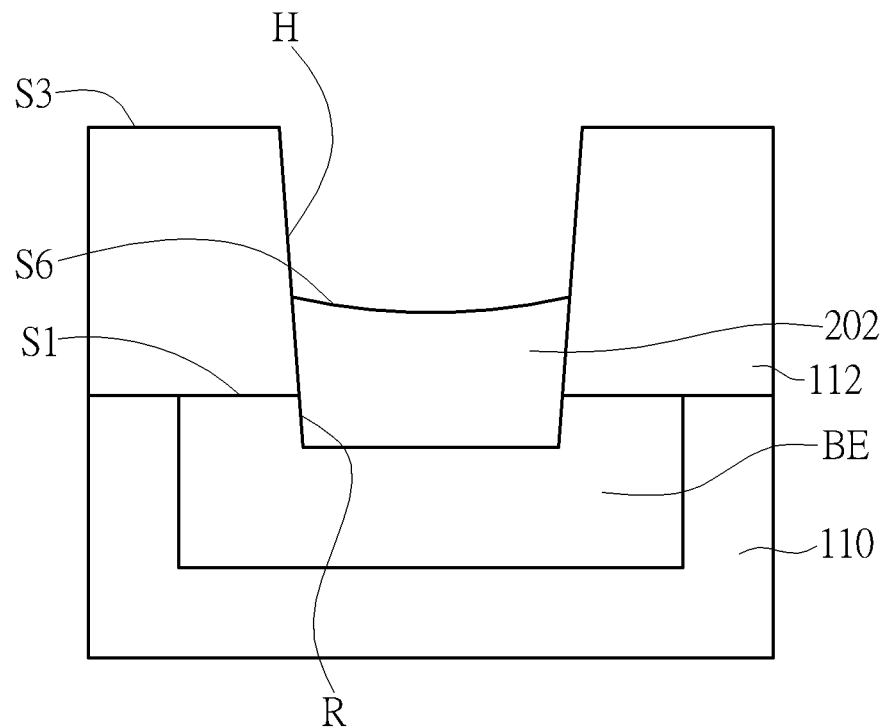

As shown in FIG. 7, next, a wet etching process is performed to etch the tantalum oxide (TaO$_x$) layer 202 in the through hole H so that the top surface S6 of the tantalum oxide (TaO$_x$) layer 202 is lower than the top surface S3 of the capping layer 112. According to an embodiment of the present invention, the top surface S6 of the tantalum oxide (TaO$_x$) layer 202 may have a concave curved profile.

Figure 8:
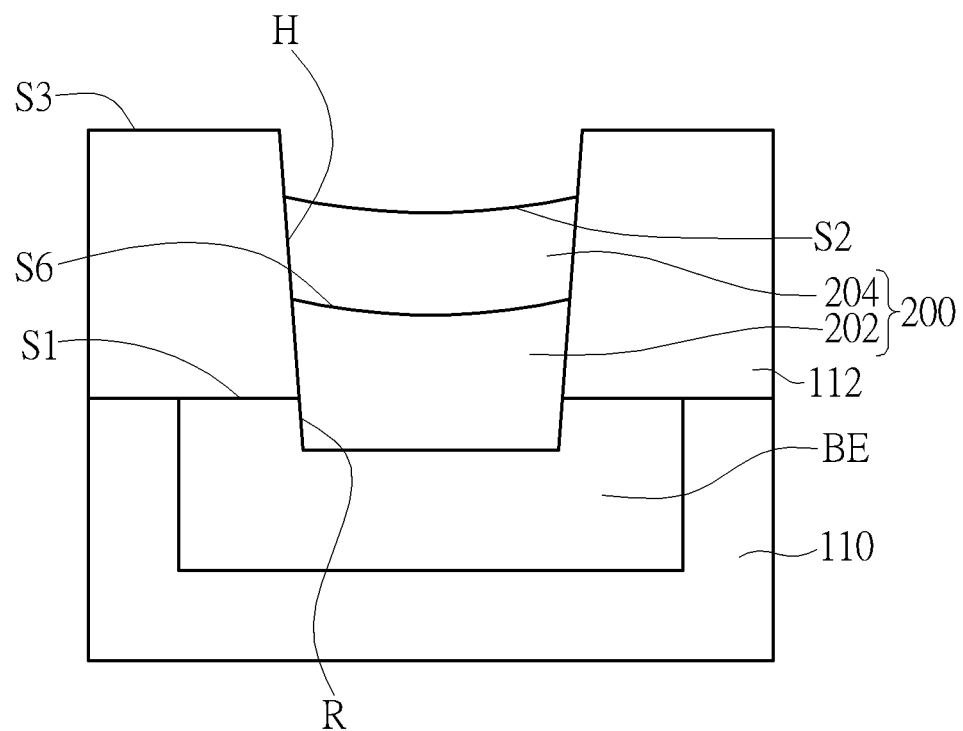

As shown in FIG. 8, next, a tantalum oxide (Ta$_2$O$_5$) layer 204 is formed in the through hole H and planarized by a chemical mechanical polishing process. Then, a wet etching process is performed to etch the tantalum oxide (Ta$_2$O$_5$) layer 204 in the through hole H so that the top surface S2 of the tantalum oxide (Ta$_2$O$_5$) layer 204 is lower than the top surface S3 of the capping layer 112. According to an embodiment of the present invention, the tantalum oxide (TaO$_x$) layer 202 and the tantalum oxide (Ta$_2$O$_5$) layer 204 constitute the variable resistance layer 200. According to an embodiment of the present invention, the tantalum oxide (TaO$_x$) layer 202 is in direct contact with the bottom electrode BE. According to an embodiment of the present invention, the recessed region R is completely filled with the tantalum oxide (TaO$_x$) layer 202.

Figure 9:
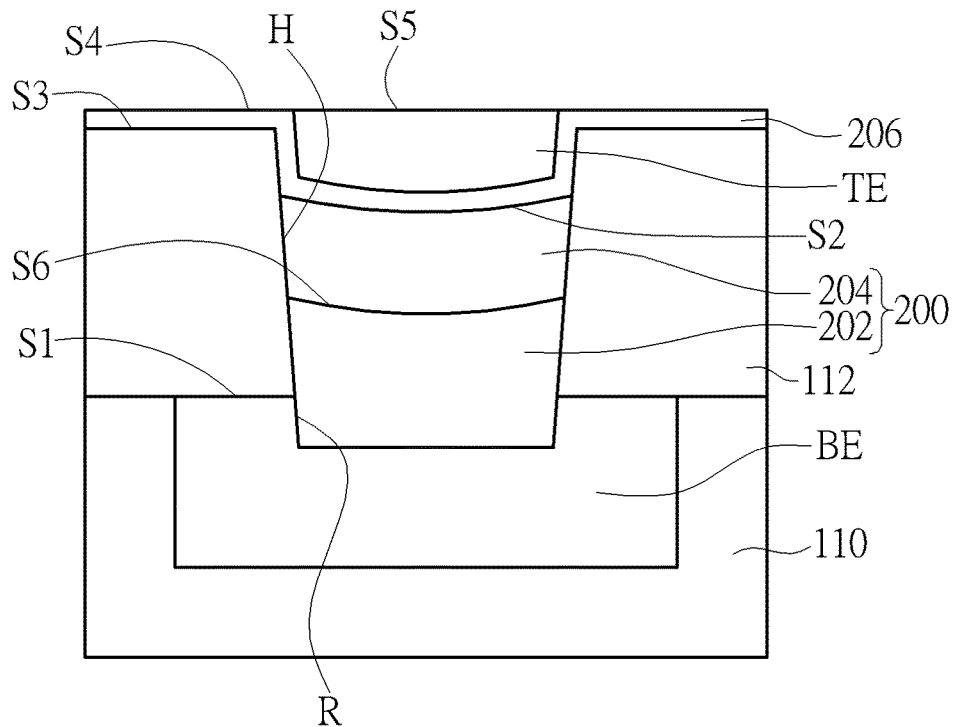
Figure 10:
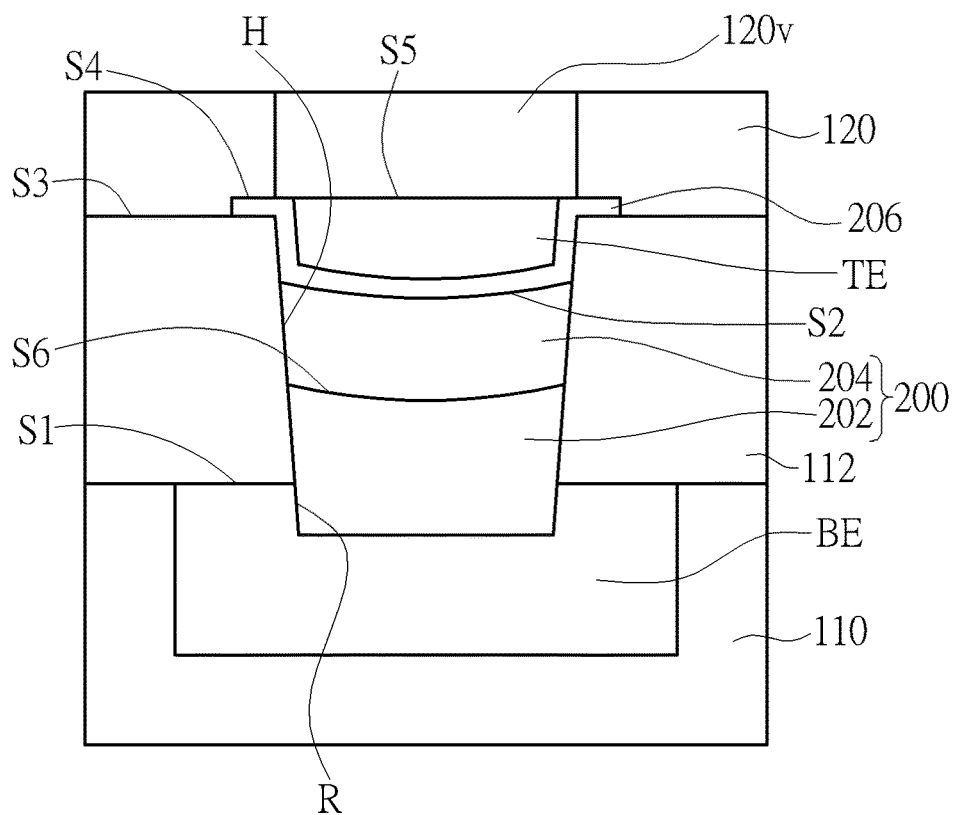

Next, as shown in FIGS. 9 and 10, a top electrode TE is formed in the through hole H and on the variable resistance layer 200. For example, first, an iridium layer is deposited conformally on the top surface S3 of capping layer 112, sidewalls of capping layer 112 over the top surface S2 of tantalum oxide (Ta$_2$O$_5$) layer 204, and the top surface S2 of the tantalum oxide (Ta$_2$O$_5$) layer 204. The top electrode TE, for example, a titanium nitride layer is then deposited, After performing the chemical mechanical polishing process, the iridium layer 206 is patterned. According to an embodiment of the present invention, the top surface S4 of the iridium layer 206 is coplanar with the top surface S5 of the top electrode TE.

Finally, a second interlayer dielectric layer 120 covering the top electrode TE and the capping layer 112 is formed, and a via structure 120v is formed in the second interlayer dielectric layer 120. The via structure 120v is in direct contact with the top electrode TE.

One technical feature of the present invention is that the resistive random access memory structure is embedded in the capping layer 112 formed between the first interlayer dielectric layer 110 and the second interlayer dielectric layer 120, and the capping layer 112 is used to protect the resistive random access memory structure. Therefore, the method of the present invention has high compatibility with the logic back-end process, and can save a photomask and reduce the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory structure, comprising:
   a first inter-layer dielectric layer;
   a bottom electrode disposed in the first inter-layer dielectric layer;
   a capping layer disposed on the bottom electrode and on the first inter-layer dielectric layer;
   a through hole disposed in the capping layer, wherein the through hole partially exposes a top surface of the bottom electrode;
   a variable resistance layer disposed within the through hole, wherein a top surface of the variable resistance layer is lower than a top surface of the capping layer;
   a top electrode disposed within the through hole and on the variable resistance layer;
   a second inter-layer dielectric layer covering the top electrode and the capping layer;
   a via structure disposed in the second inter-layer dielectric layer and in direct contact with the top electrode; and
   a wire structure disposed directly on the via structure in the second inter-layer dielectric layer and electrically connected to the via structure.

2. The resistive random access memory structure according to claim 1, wherein the variable resistance layer comprises a tantalum oxide (TaO$_x$) layer and a tantalum oxide (Ta$_2$O$_5$) layer.

3. The resistive random access memory structure according to claim 2, wherein the bottom electrode is a copper layer and the tantalum oxide (TaO$_x$) layer is in direct contact with the copper layer.

4. The resistive random access memory structure according to claim 3, wherein the bottom electrode comprises a recessed region at the top surface of the bottom electrode, and wherein the recessed region is completely filled with the tantalum oxide (TaO$_x$) layer.

5. The resistive random access memory structure according to claim 1, wherein the top electrode comprises a titanium nitride layer.

6. The resistive random access memory structure according to claim 5 further comprising:

an iridium layer disposed between the titanium nitride layer and the variable resistance layer.

7. The resistive random access memory structure according to claim 6, wherein the tantalum oxide ($Ta_2O_5$) layer has a top surface that is lower than a top surface of the capping layer.

8. The resistive random access memory structure according to claim 7, wherein the iridium layer conformally covers the top surface of the capping layer, a sidewall of the capping layer above the top surface of the tantalum oxide ($Ta_2O_5$) layer, and the top surface of the tantalum oxide ($Ta_2O_5$) layer.

9. The resistive random access memory structure according to claim 8, wherein the iridium layer has a top surface that is coplanar with a top surface of the titanium nitride layer.

10. A method of fabricating a resistive random access memory structure, comprising:
    forming a first inter-layer dielectric layer;
    forming a bottom electrode in the first inter-layer dielectric layer;
    forming a capping layer on the bottom electrode and on the first inter-layer dielectric layer;
    forming a through hole in the capping layer, wherein the through hole partially exposes a top surface of the bottom electrode;
    forming a variable resistance layer within the through hole, wherein a top surface of the variable resistance layer is lower than a top surface of the capping layer;
    forming a top electrode within the through hole and on the variable resistance layer;
    forming a second inter-layer dielectric layer covering the top electrode and the capping layer;
    forming a via structure in the second inter-layer dielectric layer and in direct contact with the top electrode; and
    forming a wire structure directly on the via structure in the second inter-layer dielectric layer, wherein the wire structure is electrically connected to the via structure.

11. The method according to claim 10, wherein the variable resistance layer comprises a tantalum oxide ($TaO_x$) layer and a tantalum oxide ($Ta_2O_5$) layer.

12. The method according to claim 11, wherein the bottom electrode is a copper layer and the tantalum oxide ($TaO_x$) layer is in direct contact with the copper layer.

13. The method according to claim 12, wherein the bottom electrode comprises a recessed region at the top surface of the bottom electrode, and wherein the recessed region is completely filled with the tantalum oxide ($TaO_x$) layer.

14. The method according to claim 10, wherein the top electrode comprises a titanium nitride layer.

15. The method according to claim 14 further comprising:
    forming an iridium layer between the titanium nitride layer and the variable resistance layer.

16. The method according to claim 15, wherein the tantalum oxide ($Ta_2O_5$) layer has a top surface that is lower than a top surface of the capping layer.

17. The method according to claim 16, wherein the iridium layer conformally covers the top surface of the capping layer, a sidewall of the capping layer above the top surface of the tantalum oxide ($Ta_2O_5$) layer, and the top surface of the tantalum oxide ($Ta_2O_5$) layer.

18. The method according to claim 17, wherein the iridium layer has a top surface that is coplanar with a top surface of the titanium nitride layer.

\* \* \* \* \*